(12) United States Patent
Fujisaku et al.

(10) Patent No.: US 12,244,320 B2
(45) Date of Patent: Mar. 4, 2025

(54) ATOMIC OSCILLATOR

(71) Applicant: NEC Corporation, Tokyo (JP)

(72) Inventors: Takahiro Fujisaku, Tokyo (JP); Kenta Matsumoto, Tokyo (JP); Sota Kagami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 13 days.

(21) Appl. No.: 18/200,850

(22) Filed: May 23, 2023

(65) Prior Publication Data

US 2023/0387926 A1    Nov. 30, 2023

(30) Foreign Application Priority Data

May 31, 2022    (JP) ................. 2022-088511

(51) Int. Cl.
  *H03L 7/26* (2006.01)
  *H01S 5/0687* (2006.01)
  *H03B 17/00* (2006.01)
(52) U.S. Cl.
  CPC .............. *H03L 7/26* (2013.01); *H01S 5/0687* (2013.01); *H03B 17/00* (2013.01)

(58) Field of Classification Search
  CPC ....... H03L 7/26; H01S 5/0687; H01S 5/0085; H01S 5/005; H03B 17/00
  See application file for complete search history.

(56) References Cited

U.S. PATENT DOCUMENTS

2018/0069560 A1*  3/2018  Tamura ................... G04F 5/145
2020/0259498 A1*  8/2020  Gerginov ............... H03B 17/00

FOREIGN PATENT DOCUMENTS

JP        2016-072371 A       5/2016

* cited by examiner

*Primary Examiner* — Jeffrey M Shin
(74) *Attorney, Agent, or Firm* — Sughrue Mion, PLLC

(57) ABSTRACT

An atomic oscillator according to the present invention includes: a light generator configured to generate two excitation lights; an alkali metal atom gas cell to which the two excitation lights are applied with a frequency difference therebetween being changed; a detecting unit configured to detect a light amount of a transmitted light having passed through the alkali metal atom gas cell; and a control unit configured to measure a resonance frequency of an alkali metal atom gas based on the detected amount of the transmitted light and control an intensity ratio of the two excitation lights applied to the alkali metal atom gas cell based on the measured resonance frequency.

9 Claims, 13 Drawing Sheets

ATOMIC OSCILLATOR

INCORPORATION BY REFERENCE

This application is based upon and claims the benefit of priority from Japanese patent application No. 2022-088511, filed on May 31, 2022, the disclosure of which is incorporated herein in its entirety by reference.

TECHNICAL FIELD

The present disclosure relates to an atomic oscillator, a control method, a control device, and a program.

BACKGROUND ART

Atomic oscillators are devices which measure accurate time based on the natural frequency of atoms. A compact atomic clock measures the natural frequency of an atom using the CPT (Coherent Population Trapping), which is a quantum interference effect occurring when an alkali metal atom gas is irradiated with an excitation light having two frequencies, as the oscillation principle of an atomic oscillator. In the CPT, when the difference between the two frequencies of the excitation light matches the transition frequency between the ground levels of the alkali metal, the excitation light is not absorbed and the amount of transmitted light becomes larger. The atomic oscillator using the CPT as the operation principle sweeps the difference between the frequencies of the excitation light, and determines the difference between the frequencies that maximizes the amount of transmitted light as the natural frequency of the atom. It is one of the performance indexes of the atomic oscillator whether or not the natural frequency of the atom can be stably acquired for a long term (long-term stability).

In the measurement of the natural frequency of the atom using the CPT, a major factor that decreases the abovementioned long-term stability is the temporal change of light shift. Light shift is phenomenon in which the natural frequency of the atom shifts due to the interaction between the excitation light and the atom. For example, it is known that the light shift occurs due to a temporal change of the intensity of the excitation light.

Regarding the problem of the light shift described above, Patent Document 1 describes suppressing the light shift by correcting the change of the intensity of the total excitation light. Specifically, in Patent Document 1, by using two types of light sources to correct the intensity of the total excitation light to a constant value, the occurrence of the light shift is suppressed.

Patent Document 1: Japanese Unexamined Patent Application Publication No. JP-A 2016-072371

However, it is difficult to keep the intensity of the total excitation light perfectly constant, and it is still difficult to suppress the occurrence of the light shift.

SUMMARY OF THE INVENTION

Accordingly, an object of the present disclosure is to provide an atomic oscillator which can solve the abovementioned problem that it is difficult to suppress the occurrence of a light shift.

An atomic oscillator as an aspect of the present disclosure includes: a light generator configured to generate two excitation lights; an alkali metal atom gas cell to which the two excitation lights are applied with a frequency difference therebetween being changed; a detecting unit configured to detect a light amount of a transmitted light having passed through the alkali metal atom gas cell; and a control unit configured to measure a resonance frequency of an alkali metal atom gas based on the detected amount of the transmitted light and control an intensity ratio of the two excitation lights applied to the alkali metal atom gas cell based on the measured resonance frequency.

Further, a control method as an aspect of the present disclosure is a control method executed by an atomic oscillator. The atomic oscillator includes a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell. The control method includes measuring a resonance frequency of an alkali metal atom gas based on the detected amount of the transmitted light and controlling an intensity ratio of the two excitation lights applied to the alkali metal atom gas cell based on the measured resonance frequency.

Further, a control device as an aspect of the present disclosure is a control device controlling an atomic oscillator. The atomic oscillator includes a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell. The control device is configured to measure a resonance frequency of an alkali metal atom gas based on the detected amount of the transmitted light and control an intensity ratio of the two excitation lights applied to the alkali metal atom gas cell based on the measured resonance frequency.

Further, a computer program as an aspect of the present disclosure includes instructions for causing a control device to execute processes. The control device controls an atomic oscillator including a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell. The processes are to measure a resonance frequency of an alkali metal atom gas based on the detected amount of the transmitted light and control an intensity ratio of the two excitation lights applied to the alkali metal atom gas cell based on the measured resonance frequency.

With the configurations as described above, the present disclosure can provide an atomic oscillator which can suppress the occurrence of light shift.

EXAMPLE EMBODIMENTS

First Example Embodiment

A first example embodiment of the present disclosure will be described with reference to FIGS. 1 to 7. FIGS. 1 to 6 are views for describing a configuration of an atomic oscillator in this example embodiment, and FIG. 7 is a view for describing an operation of the atomic oscillator.
[Configuration]

Figure 1:
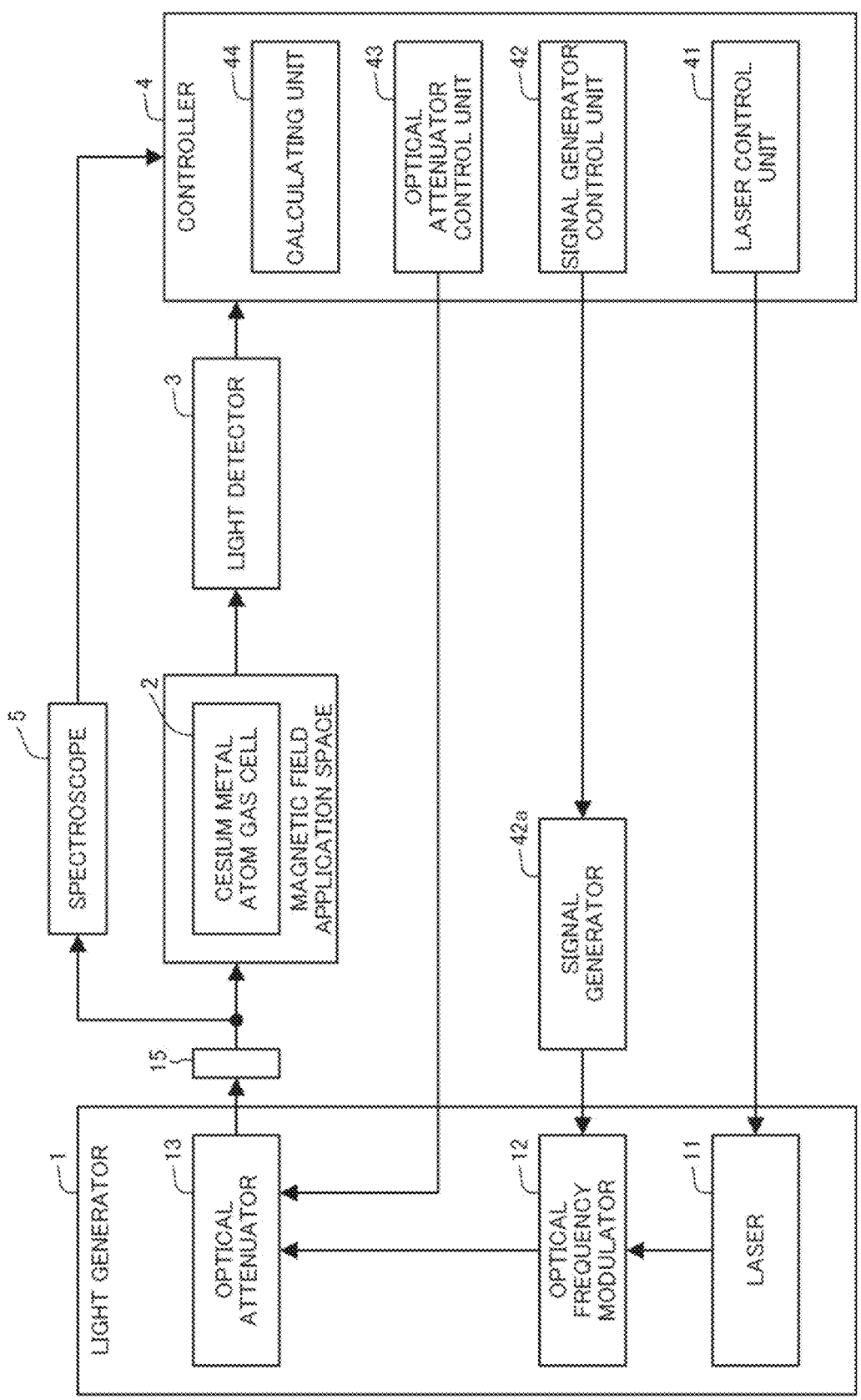
FIG. 1 is a block diagram showing a configuration of an atomic oscillator in a first example embodiment of the present disclosure.

As shown in FIG. 1, the atomic oscillator in this example embodiment primarily includes a light generator 1, a cesium metal atom gas cell 2, a light detector 3, a controller 4, and a spectroscope 5. Then, the light generator 1 includes a laser 11, an optical frequency modulator 12, and an optical attenuator 13. Moreover, the controller 4 includes a laser control unit 41, a signal generator control unit 42, an optical attenuator control unit 43, and a calculating unit 44. The controller 4 is composed of an information processing device (control device) including an arithmetic logic unit and a memory unit, and the respective units 41 to 44 included by the controller 4 are realized by execution of a program by the arithmetic logic unit.

The light generator 1 generates an excitation light of single wavelength, and also generates two excitation lights by frequency modulation from the excitation light of single wavelength and applies the two excitation lights to the cesium metal atom gas cell 2. Specifically, first, the laser 11 of the light generator 1 generates an excitation light of single wavelength of, for example, 894.5812 nm (first excitation light) based on a setting value designated by the laser control unit 41 of the controller 4. This single-wavelength excitation light is sent to the optical frequency modulator 12.

Figure 2:
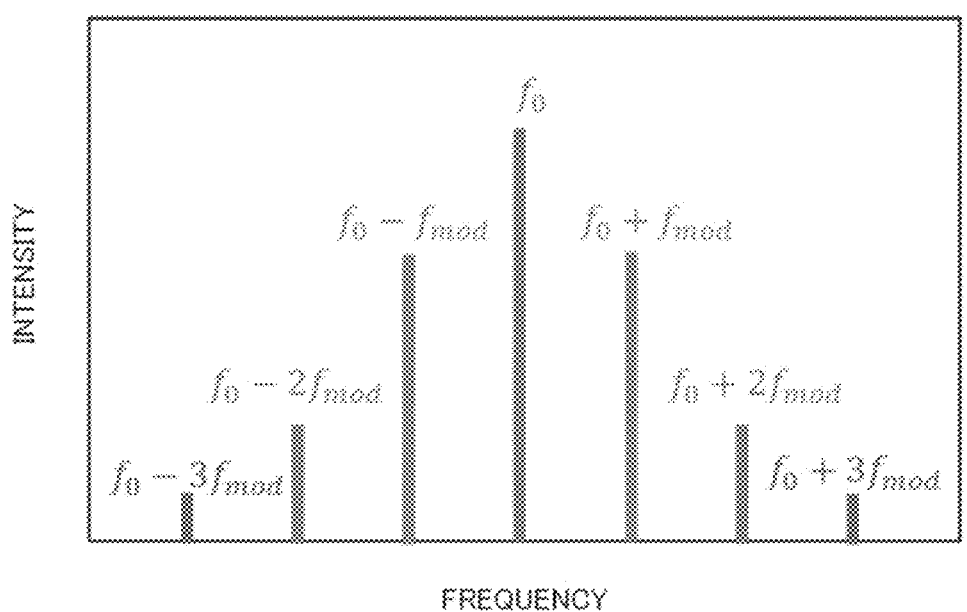
FIG. 2 is a view showing a state of processing by the atomic oscillator disclosed in FIG. 1.

The optical frequency modulator 12 performs frequency modulation on the single-wavelength excitation light to generate two excitation lights (second excitation lights) to be applied to the cesium metal atom gas cell. Specifically, the signal generator control unit 42 of the controller 4 sets a frequency modulation power and a modulation frequency, which are setting values for a signal generator 42a included. Then, the signal generator 42a controls the optical frequency modulator 12 with the set frequency modulation power and modulation frequency $f_{mod}$, and the optical frequency modulator 12 thereby generates an excitation light containing multiple frequency components including a main band ($f_0$) and side bands ($f_0 \pm f_{mod}$, $f_0 \pm 2f_{mod}$, $f_0 \pm 3f_{mod}$, ... ) as shown in FIG. 2, particularly in this example embodiment, an excitation light with two frequency components of $0^{th}$-order light and $-1^{st}$-order light as main resonance generation light sources. However, the two excitation lights generated by the optical frequency modulator 12 and used as the main resonance generation light sources are not limited to $0^{th}$-order light and $-1^{st}$-order light, and may be $0^{th}$-order light and $+1^{st}$-order light. Alternatively, another band of excitation light may be used.

Figure 3:
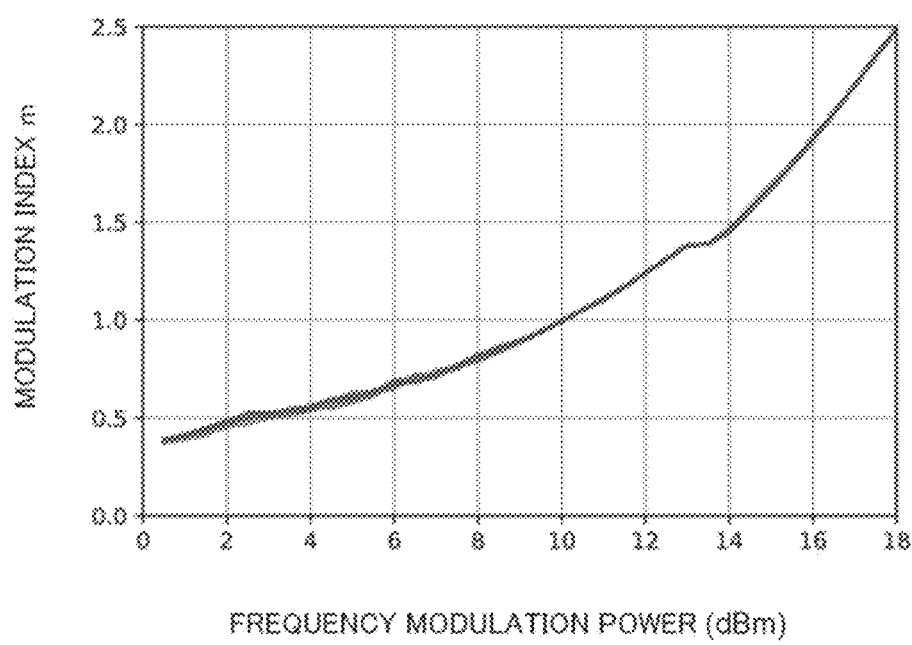
FIG. 3 is a view showing a state of processing by the atomic oscillator disclosed in FIG. 1.

In this example embodiment, by setting the frequency modulation power and the modulation frequency while changing to multiple values, the signal generator control unit 42 generates excitation lights for each of the changed setting values. That is to say, in the atomic oscillator, the two generated excitation lights are applied to the cesium metal atom gas cell 2 every time the setting values of the frequency modulation power and the modulation frequency are changed. For example, the signal generator control unit 42 sets the modulation frequency so as to sweep while changing to 1000 values around 9.19 GHz, which is equivalent to the transition frequency between the ground levels of a cesium atom. Moreover, in the case of converting the value of the frequency modulation power to a modulation index m as shown in FIG. 3, the signal generator control unit 42 sets the frequency modulation power while changing the modulation index m so that the modulation index m takes 10 values in the range of 0.88 to 2.5.

Figure 4:
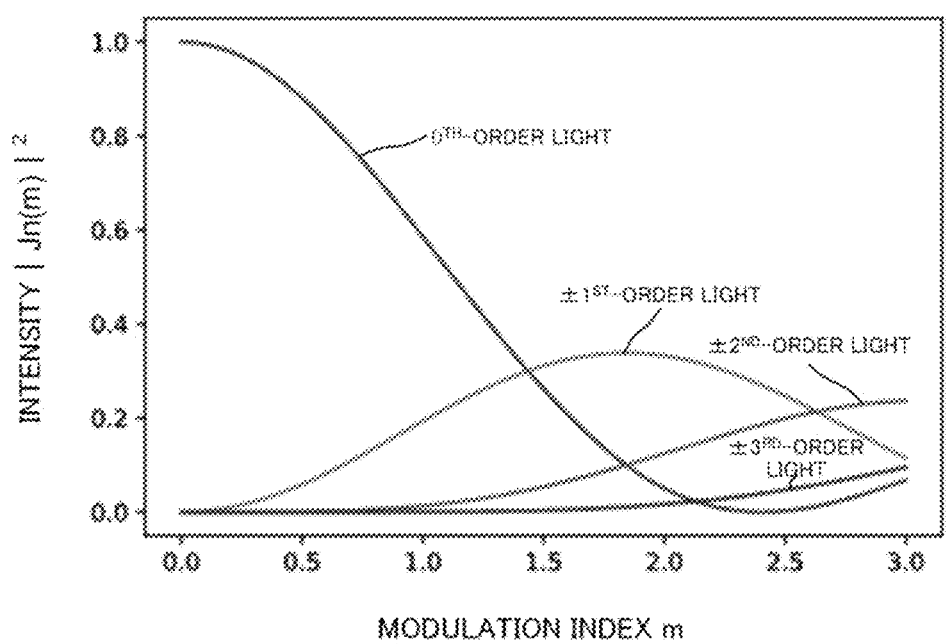
FIG. 4 is a view showing a state of processing by the atomic oscillator disclosed in FIG. 1.

The relation between the modulation index m obtained by converting the value of the frequency modulation power and the intensity of the excitation light is shown in FIG. 4. As shown in this figure, changing the modulation index m changes the intensities of the two excitation lights. In particular, when the value of the modulation index m is increased, that is, the value of the frequency modulation power is increased, the intensity of the $0^{th}$-order light as the main band decreases, and the intensity of the $-1^{st}$-order light as the side band increases. Therefore, by changing the value of the modulation index, namely, the frequency modulation power, it is possible to change the intensity ratio of the two excitation lights containing the $0^{th}$-order light and the $-1^{st}$-order light. Thus, by changing the modulation index so that the modulation index takes 10 values in the range of 0.88 to 2.5, the signal generator control unit 42 sets so that the intensity ratio of the two excitation lights takes 10 values. Then, the two excitation lights generated by frequency modulation as described above are sent to the optical attenuator 13.

The optical attenuator 13 controls to make the intensity of the excitation light to be applied attenuate to an intensity set by the optical attenuator control unit 43 of the controller 4. In this example embodiment, the optical attenuator control unit 43 changes and sets the sum of the intensities of the excitation lights of all the frequency components including the two frequency components used as the main resonance generation light sources to multiple values, and thereby generates an excitation light for each of the changed setting values. For example, the optical attenuator control unit 43 changes and sets the sum of the intensities of the excitation lights to eight values in the range of 2.0 to 11.0 µW/mm². Then, the excitation light with the intensity being set is converted to a linearly polarized light by a polarizing plate 15 such as a λ/2 plate and thereafter applied to the cesium metal atom gas cell 2. In addition, the excitation light is also made to be incident on the spectroscope 5, and the sum of the intensities of the total excitation light is detected by the spectroscope 5 and notified to the controller 4. The polarizing plate 15 may be a polarizing plate that converts to a circularly polarized light.

Thus, while changing the modulation index, namely, the intensity ratio of the two excitation lights and the sum of the intensities of the excitation lights in accordance with a command from the controller 4 and also changing the modulation frequency around 9.19 GHz, which is a resonance frequency, to sweep, the light generator 1 generates the two excitation lights and applies the two excitation lights to the cesium metal atom gas cell 2.

Specifically, the light generator 1 first sets the modulation index, namely, the intensity ratio to a first value and also sets the excitation light intensity to a first value, sweeps the modulation frequency around a resonance frequency, and thereby obtains a resonance frequency with respect to the set modulation index and excitation light intensity as will be described later. After that, the light generator 1 keeps the modulation index to the first value, and repeats sweeping the modulation frequency around the resonance frequency every time changing and setting the value of the total excitation light intensity, which is the sum of the intensities of excitation lights of all the frequency components. Furthermore, the light generator 1 changes and sets the modulation index to a second value and, every time changing and setting the total excitation light intensity to eight values in the same manner as described above, repeats sweeping the modulation frequency around the resonance frequency, and thereby obtains resonance frequencies to the eight setting values of the total excitation light intensity at the second value of the modulation index. Then, every time changing and setting the modulation index to, for example, 10 values in total, the light generator 1 repeatedly applies in the same manner as described above to obtain the resonance frequencies to the eight setting values of the excitation light intensity at the 10 values of the modulation index. Processing for the resonance frequency obtained as described above will be described later.

In the cesium metal atom gas cell 2, alkali metal atoms such as cesium atoms, rubidium atoms, sodium atoms, or potassium atoms are enclosed. In the first example embodiment, cesium atoms are enclosed in the gas cell. The cesium metal atom gas cell 2 is installed in a magnetic field application space and, as described above, the excitation light from the light generator 1 is made to be incident thereon and part thereof is transmitted thereby.

The light detector 3 (detecting unit) detects a transmitted light having passed through the cesium metal atom gas cell 2 and measures a transmitted light amount, which is the amount of the transmitted light. Since the excitation light is applied while the setting values of the modulation index, namely, the intensity ratio, the total excitation light intensity, and the modulation frequency are changed as described above, the measured transmitted light amount is passed to the controller 4 in association with the changed setting values.

Figure 5:
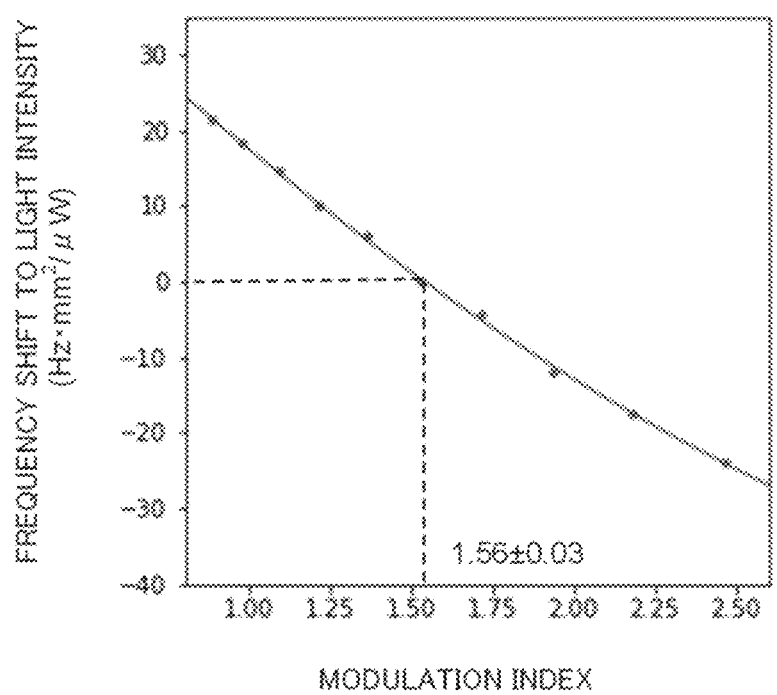
FIG. 5 is a view showing a state of processing by the atomic oscillator disclosed in FIG. 1.

The calculating unit 44 included by the controller 4 has a function of calculating a modulation index, namely, an intensity ratio that enables suppression of the occurrence of a light shift from the transmitted light amount measured as described above. Specifically, the calculating unit 44 first plots the values of the resonance frequency with respect to the eight setting values of the total excitation light intensity for each value of the modulation index, and performs line fitting on the plot. Consequently, the slope of the resonance frequency with respect to the change of the total excitation light intensity can be obtained for each value of the modulation index. That is to say, 10 pairs of the modulation index and the slope of the resonance frequency with respect to the change of the total excitation light intensity can be obtained. It can be said that the obtained slope is a frequency shift to the total excitation light intensity at each modulation index. Then, as shown in FIG. 5, the calculating unit 44 plots the frequency shifts, which are the slopes to the modulation indexes, and generates a graph fitted by a polynomial. Furthermore, the calculating unit 44 calculates a modulation index at which the frequency shift is 0 on the graph, and determines the modulation index as a modulation index to be set later. In the example of FIG. 5, the modulation index is calculated as 1.56±0.03. The calculating unit 44 is not necessarily limited to calculating the modulation index by the method described above. For example, the calculating unit 44 may calculate and determine the value of the modulation index so that the value of the frequency shift is close to 0 based on the plot of frequency shifts, which are the slopes to the modulation index.

Figure 6:
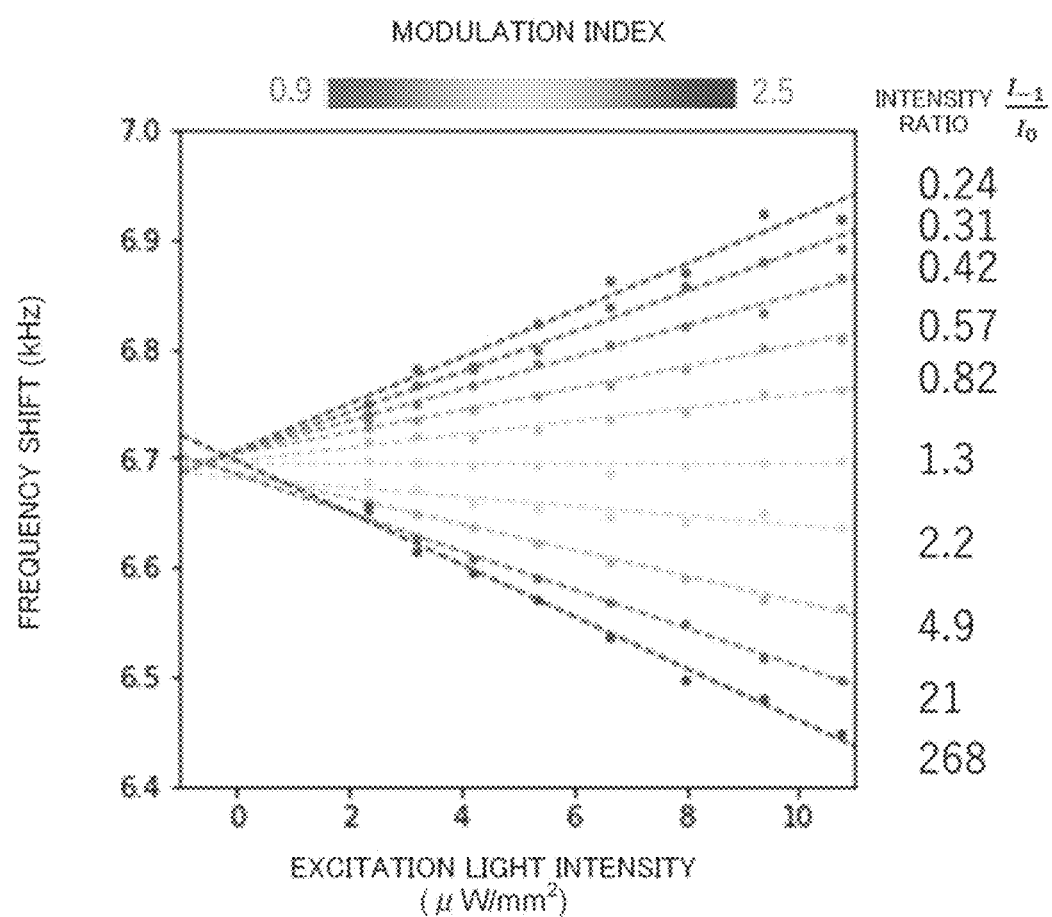
FIG. 6 is a view showing a state of processing by the atomic oscillator disclosed in FIG. 1.
Figure 7:
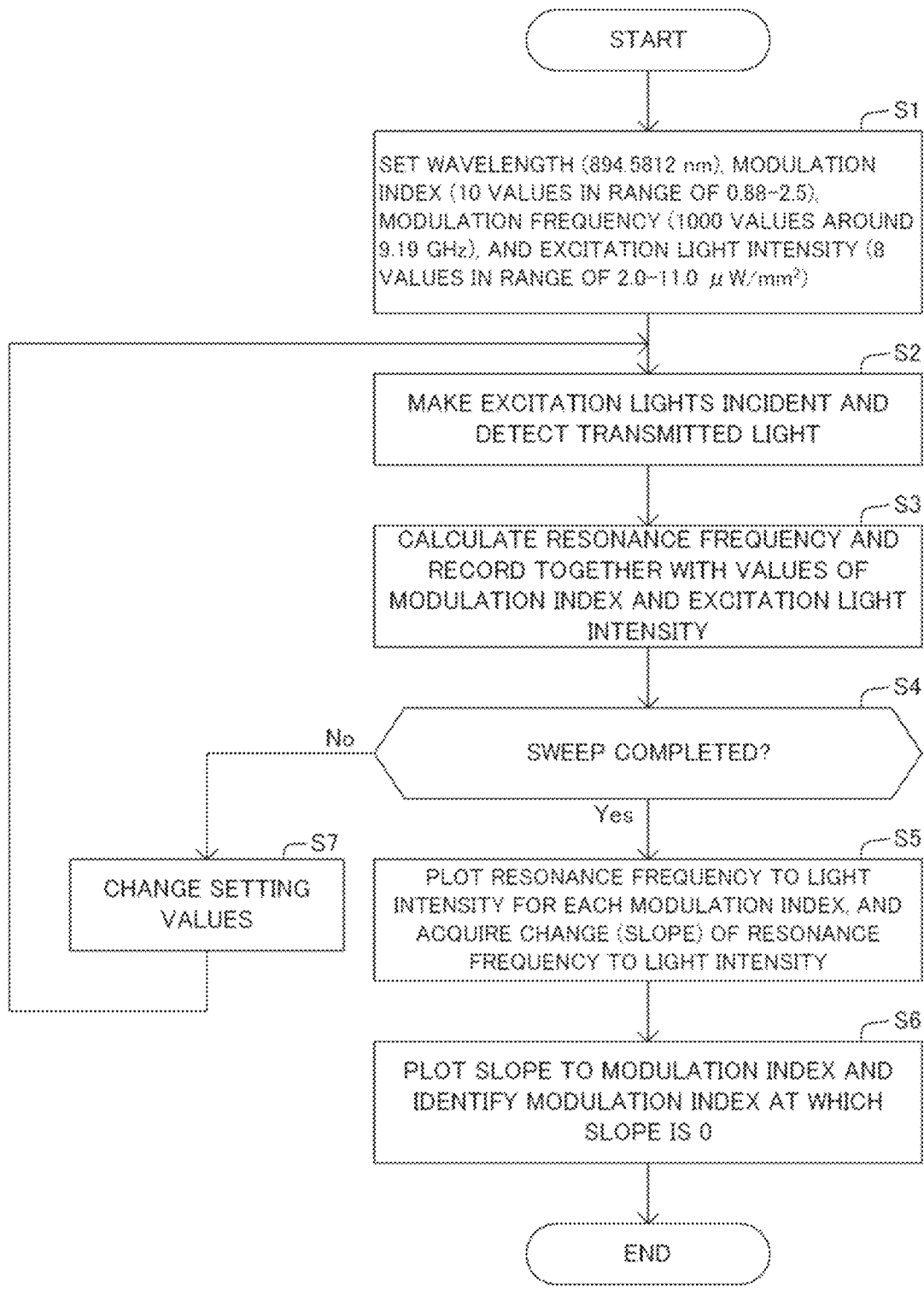
FIG. 7 is a flowchart showing a processing operation of the atomic oscillator disclosed in FIG. 1.

FIG. 6 shows a graph where the frequency shift is measured by changing the total light intensity every time the value of modulation, that is, the intensity ratio of the two lights is changed. Each straight line graph in this figure represents the relation of a frequency shift to a total excitation light intensity at each modulation index, that is, at each intensity ratio. From this graph, it can be seen that there exists a modulation index, namely, an intensity ratio at which no frequency shift occurs even when the total excitation light intensity changes. For example, in the example of FIG. 6, it can be seen that no frequency shift occurs even when the total excitation light intensity changes at an intensity ratio of 1.3. Therefore, as described above, the calculating unit 44 calculates a modulation index at which the frequency shift is 0 on the graph of FIG. 5.

The calculating unit 44 notifies the modulation index calculated and determined as described above to the signal generator control unit 42. The signal generator control unit 42 determines the value of a frequency modulation power equivalent to the determined modulation index, as the setting value for the signal generator 42a. Consequently, the signal generator 42a controls the optical frequency modulator 12 by the set frequency modulation power, and an excitation light with the occurrence of a frequency shift being suppressed can be thereby generated.

[Operation]

Next, an operation of the atomic oscillator described above, particularly, an operation when calculating a modulation index such that the occurrence of a frequency shift can be suppressed will be described with reference to a flowchart of FIG. 7.

First, in the controller 4, the respective control units 41, 42 and 43 set the setting values for the light generator 1 in the following manner, and an excitation light is thereby generated (step S1). Specifically, the laser 11 generates an excitation light of single wavelength of, for example, 894.5812 nm. Then, the optical frequency modulator 12 performs frequency modulation on the single-wavelength excitation light to generate two excitation lights to be applied to the cesium metal atom gas cell. The optical frequency modulator 12 changes a modulation index equivalent to a frequency modulation power so that the modulation index takes 10 values in the range of 0.88 to 2.5, for example. The optical frequency modulator 12 also changes the modulation frequency to 1000 values around 9.19 GHz, which is equivalent to the transition frequency between the ground levels of a cesium atom, for example. Furthermore, the optical attenuator control unit 43 changes a total excitation light intensity to eight values within the range of 2.0 to 11.0 µW/mm², for example. Thus, the controller 4 changes the modulation frequency so as to sweep around the transition frequency for each value of the modulation index and each value of the excitation light intensity.

Then, while changing the modulation index, namely, the intensity ratio of the two excitation lights and the total excitation light intensity and also changing the modulation frequency around 9.19 GHz, which is the resonance frequency, to sweep, the light generator 1 generates two excitation lights and applies the two excitation lights to the cesium metal atom gas cell 2, and the light detector 3 detects a transmitted light having passed through the cesium metal atom gas cell 2 (step S2). Consequently, a measured transmitted light amount is passed to the controller 4 in association with the changed setting values of the modulation index, the total excitation light intensity, and the modulation frequency.

Subsequently, the controller 4 calculates a resonance frequency with respect to the set modulation index and total excitation light intensity from the measured transmitted light amount, and stores the resonance frequency in association with the values of the set modulation frequency index and total excitation light intensity (step S3). The controller 4 repeats the above processing until the measurement of the transmitted light amount with all the setting values of the modulation index and the total light intensity is completed (No at step S4, step S7).

When the measurement of the transmitted light amount with all the setting values of the modulation index and the total excitation light intensity is completed (Yes at step S4), the controller 4 calculates a modulation index, namely, an intensity ratio that enables suppression of the occurrence of light shift and determines as a later setting value in the following manner. First, the controller 4 plots the values of the resonance frequency with respect to eight setting values of the total excitation light intensity for each of the values of the modulation index, and performs line fitting on the plot. Then, the controller 4 obtains the slope of the resonance frequency with respect to the change of the total excitation light intensity from a straight line obtained by fitting (step S5). Consequently, the controller 4 obtains 10 pairs of the modulation index and the slope of the resonance frequency with respect to the change of the total excitation light intensity. Subsequently, as shown in FIG. 5, the controller 4 plots frequency shifts, which are the slopes to the modulation index, generates a graph fitted by a polynomial, and calculates a modulation index at which the frequency shift is 0 on the graph (step S6). In the example of FIG. 5, the modulation index is calculated as 1.56±0.03, which can be determined as the later setting value.

After that, the controller 4 determines a frequency modulation power equivalent to the modulation index calculated and determined as described above as the setting value for the signal generator 42a, and an excitation light with the occurrence of a frequency shift being suppressed can be generated.

Second Example Embodiment

Figure 8:
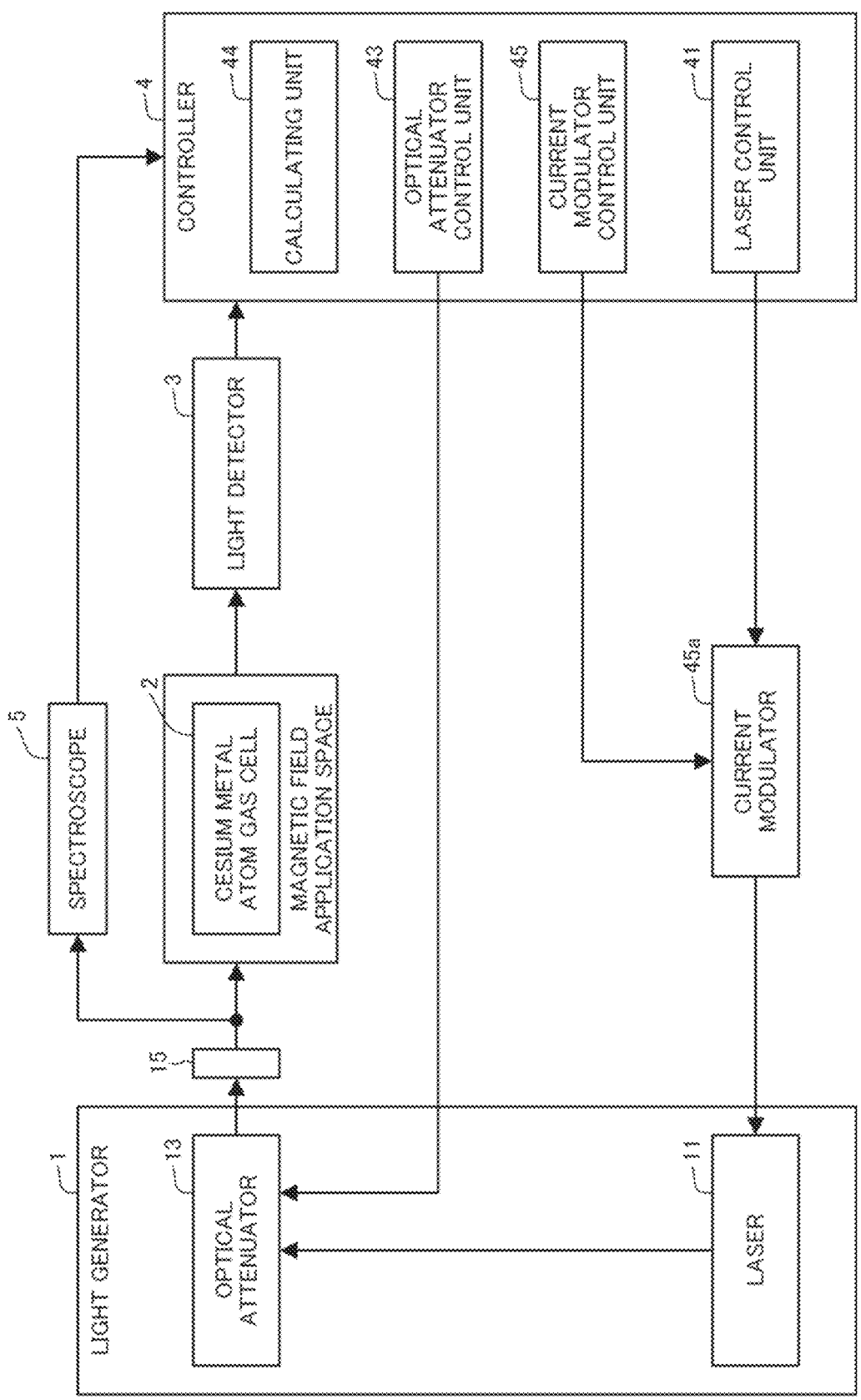
FIG. 8 is a block diagram showing a configuration of an atomic oscillator in a second example embodiment of the present disclosure.
Figure 9:
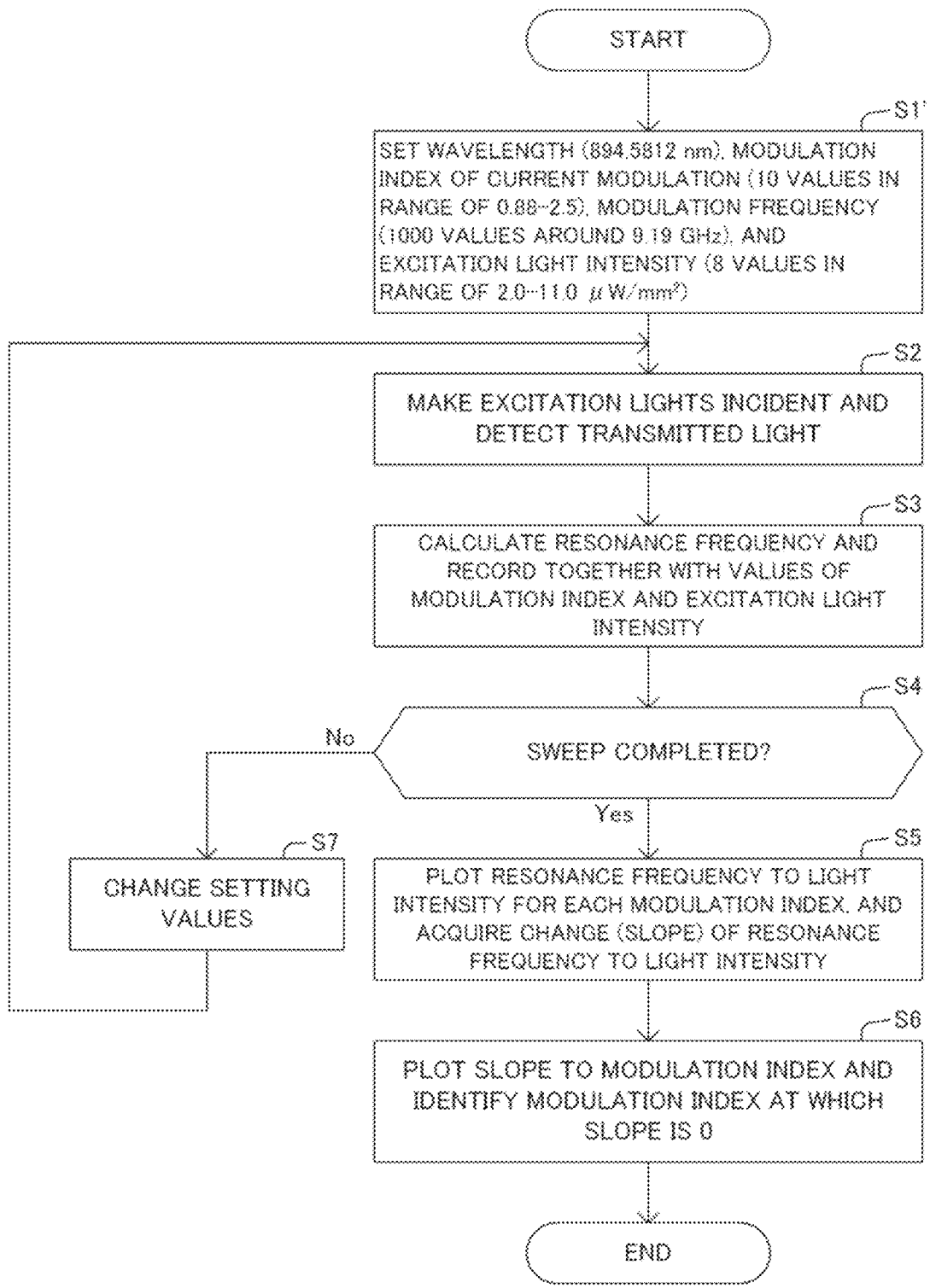
FIG. 9 is a flowchart showing a processing operation of the atomic oscillator disclosed in FIG. 8.

Next, a second example embodiment of the present disclosure will be described with reference to FIGS. 8 and 9. FIG. 8 is a block diagram showing a configuration of an atomic oscillator in a second example embodiment, and FIG. 9 is a flowchart showing an operation of the atomic oscillator.

[Configuration]

The atomic oscillator in this example embodiment has almost the same configuration as the atomic oscillator in the first example embodiment described above, but is different in the configuration to generate two excitation lights. Below, the different configuration in this example embodiment will be mainly described.

As shown in FIG. 8, the atomic oscillator includes a current modulator 45a that inputs a drive current to the laser 11 of the light generator 1. The current modulator 45a can set the frequency modulation power of the drive current and the modulation frequency. The controller 4 of the atomic oscillator includes a current modulator control unit 45 that sets the setting value for the current modulator 45a. The current modulator control unit 45 changes the setting value of the frequency modulation power of the drive current of the laser 11, and an excitation light containing multiple frequency components including a main band ($f_0$) and side bands ($f_0 \pm f_{mod}$, $f_0 \pm 2f_{mod}$, $f_0 \pm 3f_{mod}$, . . . ) as shown in FIG. 2 is thereby generated by the laser 11, particularly, in this example embodiment, an excitation light in which two frequency components of $0^{th}$-order light and $1^{st}$-order light are main resonance generation light sources is generated. In the same manner as described above, since the frequency modulation power can be converted to a modulation index, and the intensity of the excitation light changes when the modulation index is changed, the current modulator control unit 45 changes the setting value of the frequency modulation power of the drive current of the laser 11, and the intensity ratio of the two excitation lights to be generated can be thereby changed. Thus, the current modulator control unit 45 changes the modulation index so that the modulation index takes 10 values in the range of 0.88 to 2.5, and the intensity ratio of the two excitation lights is thereby set so as to take 10 values. Then, the two excitation lights generated by frequency modulation as described above are sent to the optical attenuator 13.

[Operation]

Next, an operation of the atomic oscillator described above, particularly, an operation when calculating a modulation index such that the occurrence of a frequency shift can be suppressed will be described with reference to a flowchart of FIG. 9.

First, in the controller 4, the respective control units 41, 43 and 43 set the setting values for the light generator 1 in the following manner, and an excitation light is thereby generated (step S1'). Specifically, first, the laser control unit 41 sets so that the laser 11 generates an excitation light of single wavelength of, for example, 894.5812 nm in a case where a drive current is not modulated. Then, the current modulator control unit 45 sets the frequency modulation power of the drive current of the laser 11 and performs frequency modulation on the excitation light, and two excitation lights to be applied to the cesium metal atom gas cell 2 are thereby generated. The current modulator control unit 45 changes the value of a modulation index equivalent to the value of the frequency modulation power to 10 values in the range of 0.88 to 2.5, for example. Moreover, the current modulator control unit 45 changes the modulation frequency to 1000 values around 9.19 GHz equivalent to the transition frequency between the ground levels of the cesium atom, for example. Furthermore, the optical attenuator control unit 43 changes a total excitation light intensity, which is the sum of intensities of excitation lights of all the frequency components to eight values in the range of 2.0 to 11.0 µW/mm², for example. Thus, the control unit 4 changes the modulation frequency so as to sweep around the transition frequency for each value of the modulation index and each value of the total excitation light intensity.

Then, while changing the modulation index, namely, the intensity ratio of the two excitation lights and the total excitation light intensity as described above and also changing the modulation frequency around 9.19 GHz, which is around the resonance frequency, to sweep, the light generator 1 generates two excitation lights and applies the two excitation lights to the cesium metal atom gas cell 2, and the light detector 3 detects a transmitted light having passed through the cesium metal atom gas cell 2 (step S2). Consequently, a measured transmitted light amount is passed to the controller 4 in association with the respective setting values of the modulation index, the total excitation light intensity, and the modulation frequency.

Subsequently, the controller 4 calculates a resonance frequency with respect to the set modulation index and total excitation light intensity from the measured transmitted light amount, and stores the resonance frequency and the setting values of the modulation frequency and total excitation light intensity in association with each other (step S3). The controller 4 repeats the above processing until the measurement of the transmitted light amount is completed with all the setting values of the modulation index and total excitation light intensity (No at step S4, step S7).

When the measurement of the transmitted light amount is completed with all the setting values of the modulation index and the total excitation light intensity (Yes at step S4), the controller 4 calculates a modulation index, namely, an intensity ratio such that the occurrence of light shift can be suppressed in the following manner. First, the controller 4 plots the values of the resonance frequency with respect to the eight setting values of the total excitation light intensity for each of the values of the modulation index, and performs line fitting on the plot. Then, the controller 4 obtains the slope of the resonance frequency with respect to the change of the total excitation light intensity from a straight line obtained by fitting (step S5). Consequently, the controller 4 obtains 10 pairs of the modulation index and the slope of the resonance frequency with respect to the change of the total excitation light intensity. Subsequently, as shown in FIG. 5, the controller 4 plots a frequency shift, which is the slope with respect to the modulation index, generates a graph fitted by a polynomial, and calculates a modulation index at which the frequency shift becomes 0 on the graph (step S6).

The current modulator control unit 45 of the controller 4 determines a frequency modulation power equivalent to the modulation index calculated as described above as a setting value for the current modulator 45*a*, and an excitation light with the occurrence of a frequency shift being suppressed can be generated.

Third Example Embodiment

Figure 10:
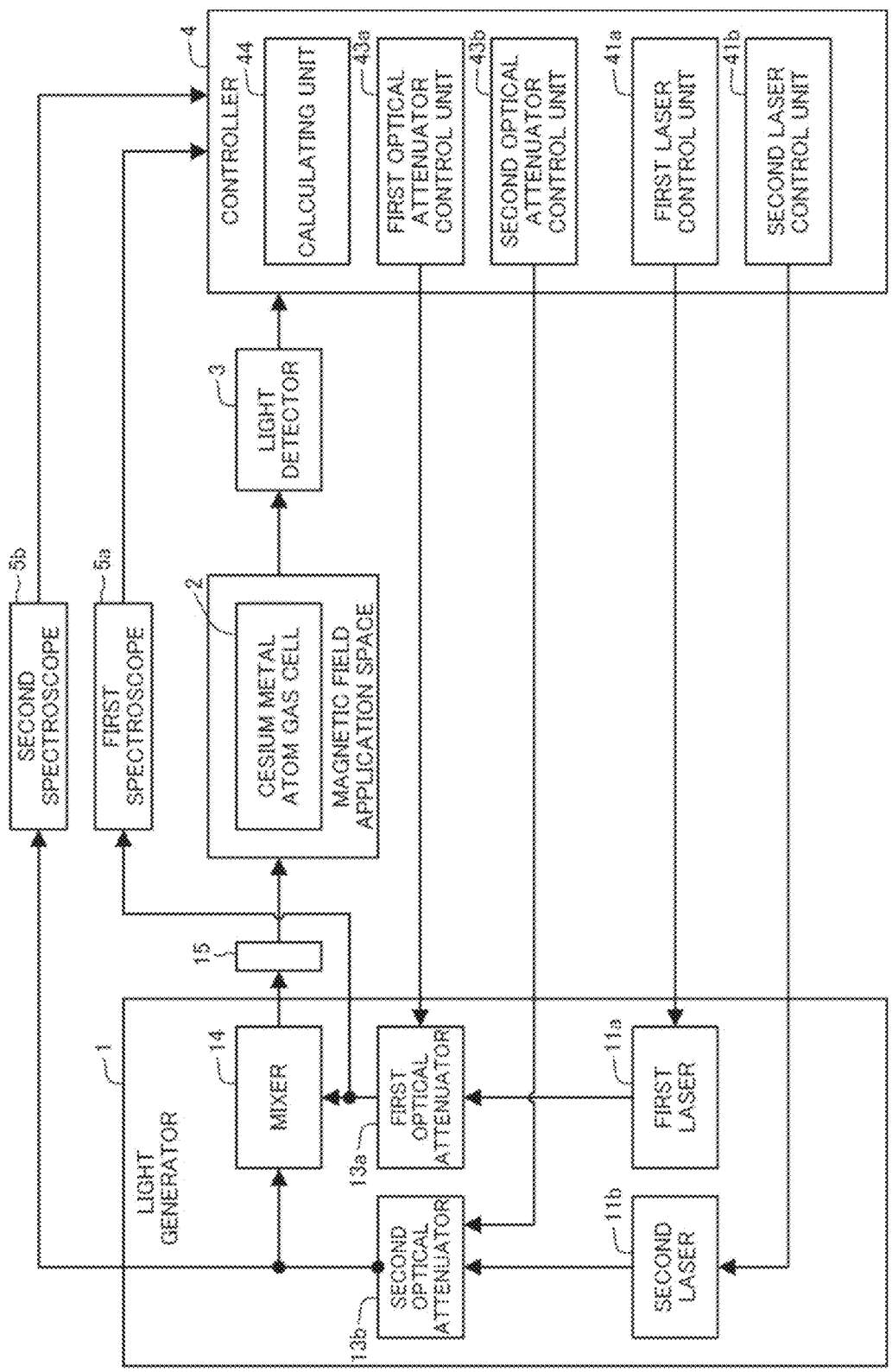
FIG. 10 is a block diagram showing a configuration of an atomic oscillator in a third example embodiment of the present disclosure.
Figure 11:
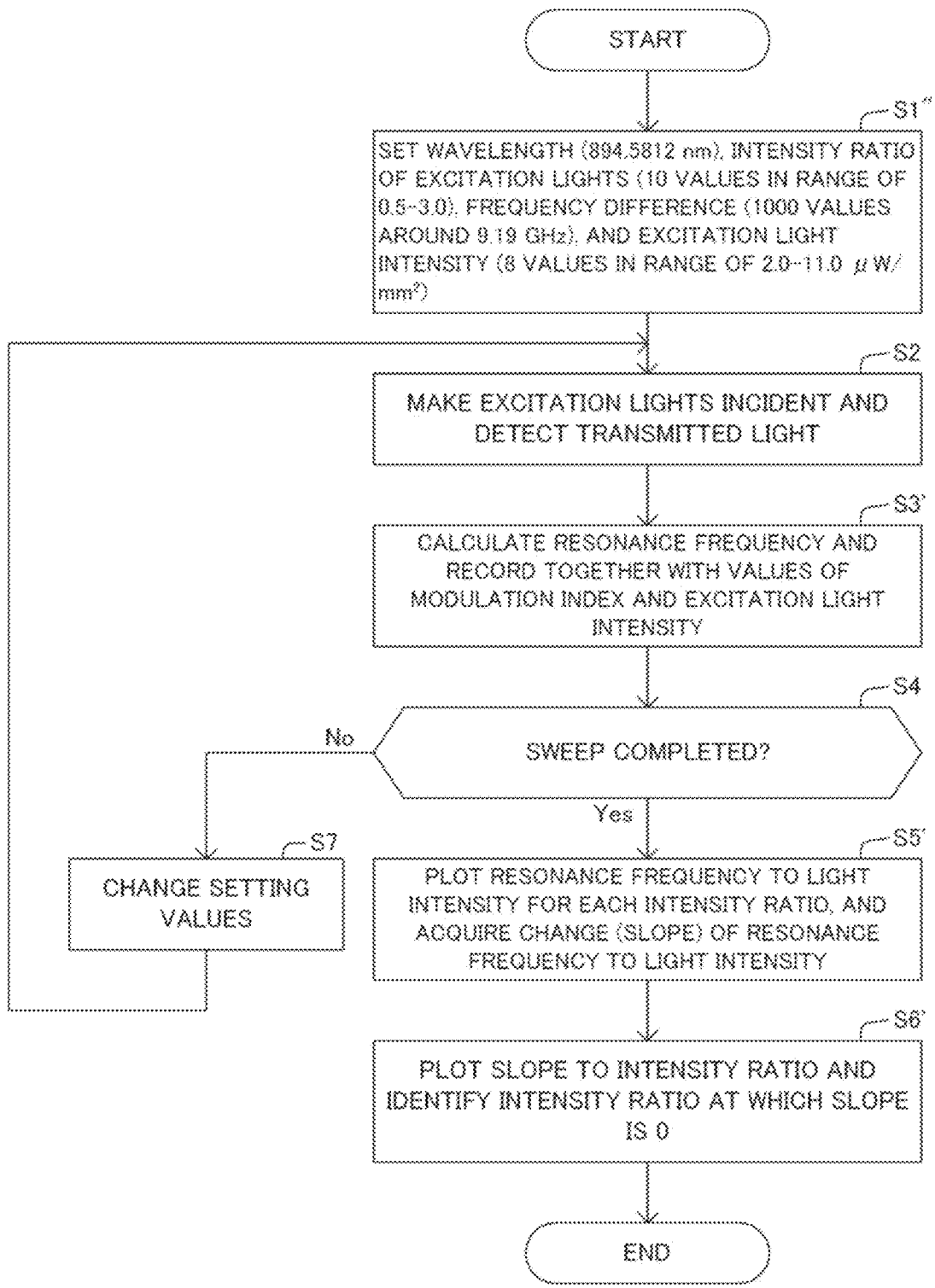
FIG. 11 is a flowchart showing a processing operation of the atomic oscillator disclosed in FIG. 10.

Next, a third example embodiment of the present disclosure will be described with reference to FIGS. 10 and 11. FIG. 10 is a block diagram showing a configuration of an atomic oscillator in the third example embodiment, and FIG. 11 is a flowchart showing an operation of the atomic oscillator.

[Configuration]

The atomic oscillator in this example embodiment has almost the same configuration as the atomic oscillator in the first example embodiment described above, but has a different configuration to generate two excitation lights. Below, the different configuration in this example embodiment will be mainly described.

As shown in FIG. 10, the atomic oscillator includes a first laser 11*a* and a second laser 11*b*, which are two light sources generating excitation lights of different frequency components, respectively. Then, the atomic oscillator includes first and second optical attenuators 13*a* and 13*b* and first and second spectroscopes 5*a* and 5*b* corresponding to the first laser 11*a* and the second laser 11*b*, respectively. Moreover, the atomic oscillator includes a mixer 14 that mixes the excitation lights generated from the first laser 11*a* and the second laser 11*b*, respectively. Furthermore, the control unit 4 includes a first laser control unit 41*a* and a second laser control unit 41*b* corresponding to the first laser 11*a* and the second laser 11*b*, respectively, and includes a first optical attenuator control unit 43*a* and a second optical attenuator control unit 43*b* corresponding to the first optical attenuator 13*a* and the second optical attenuator 13*b*, respectively.

Then, the first laser 11*a* and the second laser 11*b* are controlled by the first laser control unit 41*a* and the second laser control unit 41*b* to generate excitation lights of single wavelength of, for example, 894.5812 nm, respectively. The first laser control unit 41*a* and the second laser control unit 41*b* sets the frequency difference of the excitation lights from the first laser 11*a* and the second laser 11*b* by changing to 1000 values around 9.19 GHz corresponding to the transition frequency between the ground levels of a cesium atom. For example, the first laser control unit 41*a* and the second laser control unit 41*b* set the frequency of the excitation light from one of the first and second lasers 11*a* and 11*b* to a value around 9.19 GHz equivalent to the transition frequency between the ground levels of a cesium atom, and set the frequency of the other excitation light by changing so that the frequency difference from the one excitation light becomes a value around 9.19 GHz equivalent to the transition frequency between the ground levels of a cesium atom.

Further, by referring to values measured by the first spectroscope 5*a* and the second spectroscope 5*b*, the first optical attenuator control unit 43*a* and the second optical attenuator control unit 43*b* control the first optical attenuator 13*a* and the second optical attenuator 13*b* to change and set the intensity ratio of the excitation lights from the first laser 11*a* and the second laser 11*b*. For example, the intensity ratio is set so as to take 10 values in the range of 0.5 to 3.0. Furthermore, the first optical attenuator control unit 43*a* and the second optical attenuator control unit 43*b* control the first optical attenuator 13*a* and the second optical attenuator 13*b* to change and set the sum of the intensities of the excitation lights from the first laser 11*a* and the second laser 11*b* to multiple values, and thereby generate excitation light for each of the changed setting values. For example, the first optical attenuator control unit 43*a* and the second optical attenuator control unit 43*b* control to change and set the total excitation light intensity, which is the sum of the intensities of the two excitation lights, to eight values in the range of 2.0 to 11.0 $\mu W/mm^2$.

[Operation]

Next, an operation of the atomic oscillator described above, particularly, an operation when calculating a modulation index that enables suppression of occurrence of a frequency shift will be described with reference to the flowchart of FIG. 11.

First, in the controller 4, the respective control units 41*a*, 41*b*, 43*a* and 43*b* set the setting values for the light generator 1 in the following manner, and excitation lights are thereby generated (step S1"). Specifically, first, with reference to a value measured by the first spectroscope 5*a*, the first laser control unit 41*a* sets so that the first laser 11*a* generates an excitation light of single wavelength of, for example, 894.5812 nm. Then, the second laser control unit 41b sets so that the second laser 11b generates an excitation light such that the frequency difference between the excitation lights of the first laser 11a and the second laser 11b is changed to 1000 values around 9.19 GHz. Moreover, with reference to values measured by the first spectroscope 5a and the second spectroscope 5b, the first optical attenuator control unit 43a and the second optical attenuator control unit 43b set so that the intensity ratio of the excitation lights from the first laser 11a and the second laser 11b takes 10 values in the range of 0.5 to 3.0, for example. Furthermore, the first optical attenuator control unit 43a and the second optical attenuator control unit 43b control the first optical attenuator 13a and the second optical attenuator 13b to change and set the total excitation light intensity, which is the sum of the intensities of the excitation lights from the first laser 11a and the second laser 11b, to eight values in the range of 2.0 to 11.0 $\mu W/mm^2$.

Then, while changing the intensity ratio of the two excitation lights and the total excitation light intensity as described above and also changing the frequency difference around 9.19 GHz, which is around a resonance frequency, to sweep, the light generator 1 generates two excitation lights and applies the two excitation lights to the cesium metal atom gas cell 2, and the light detector 3 detects a transmitted light having passed through the cesium metal atom gas cell 2 (step S2). Consequently, a measured transmitted light amount is passed to the controller 4 in association with the changed setting values of the intensity ratio, the total excitation light intensity, and the modulation frequency.

Subsequently, the controller 4 calculates a resonance frequency with respect to the set intensity ratio and total excitation light intensity from the measured transmitted light amount, and stores the resonance frequency in association with the values of the set intensity ratio and total excitation light intensity (step S3'). The above processing is repeated until the measurement of the transmitted light amount is completed with all the setting values of the intensity ratio and the total excitation light intensity (No at step S4, step S7).

When the measurement of the transmitted light amount is completed with all the setting values of the intensity ratio and the total excitation light intensity (Yes at step S4), the controller 4 calculates an intensity ratio such that the occurrence of a light shift can be suppressed in the following manner. First, the controller 4 plots the values of the resonance frequency with respect to the eight setting values of the total excitation light intensity for each of the values of the intensity ratio, and performs line fitting on the plot. Then, the controller 4 obtains the slope of the resonance frequency with respect to a change of the total excitation light intensity from a straight line obtained by fitting (step S5'). Consequently, the controller 4 obtains 10 pairs of the intensity ratio and the slope of the resonance frequency with respect to the change of the total excitation light intensity. Subsequently, the controller 4 plots a frequency shift, which is the slope with respect to the intensity ratio, to generate a graph obtained by fitting using a polynomial, and calculates an intensity ratio at which the frequency shift is 0 on the graph (step S6').

In the controller 4, the first optical attenuator control unit 43a and the second optical attenuator control unit 43b determine the intensity ratio calculated in the above manner as the setting values for the first optical attenuator 13a and the second optical attenuator 13b, and an excitation light such that the occurrence of a frequency shift is suppressed can be thereby generated.

Fourth Example Embodiment

Figure 12:
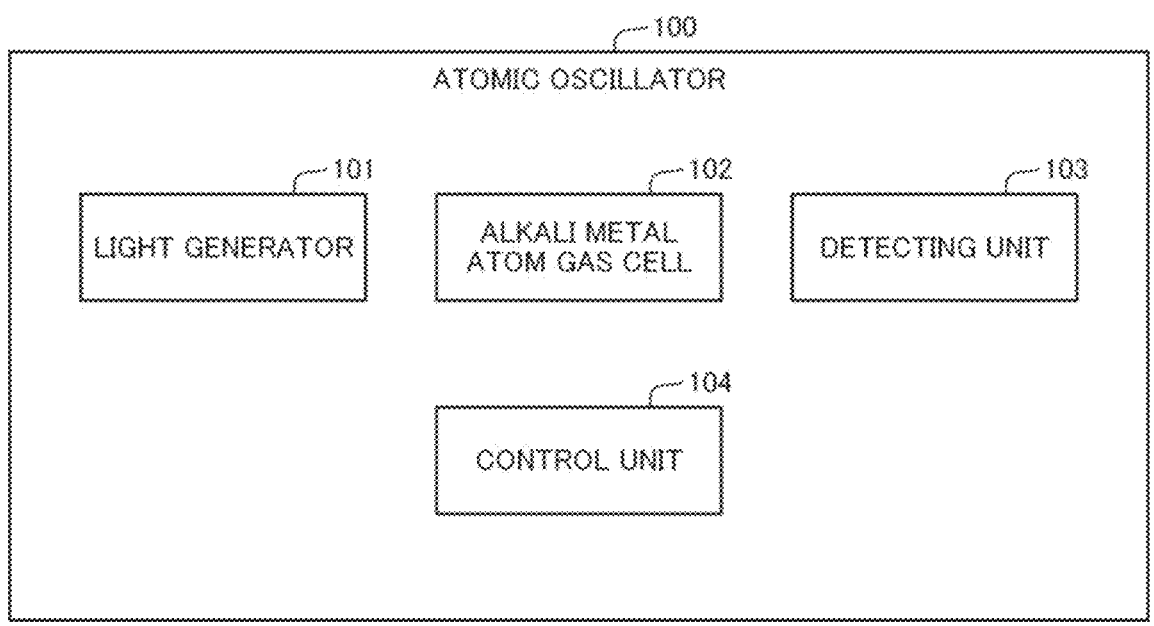
FIG. 12 is a block diagram showing a configuration of an atomic oscillator in a fourth example embodiment of the present disclosure.
Figure 13:
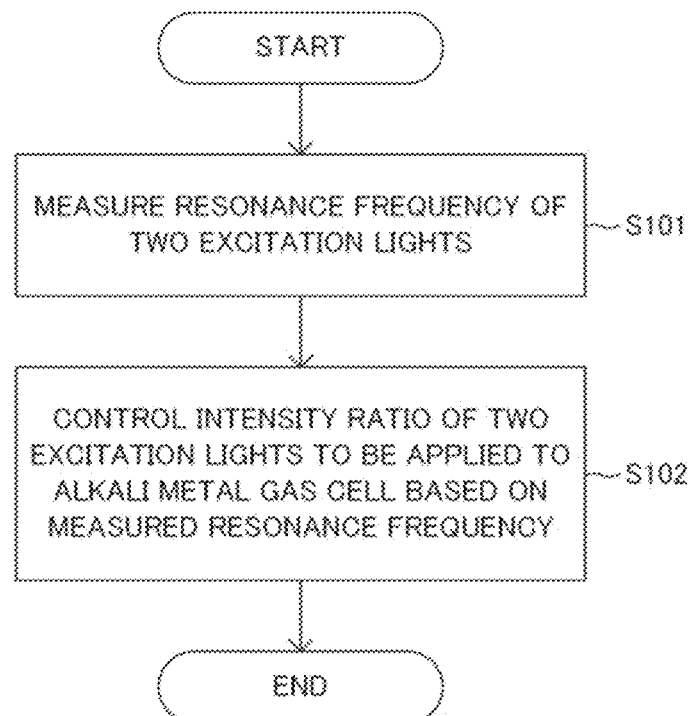
FIG. 13 is a flowchart showing an operation of the atomic oscillator in the fourth example embodiment of the present disclosure.

Next, a fourth example embodiment of the present disclosure will be described with reference to FIGS. 12 and 13. FIG. 12 is a block diagram showing a configuration of an atomic oscillator in the fourth example embodiment, and FIG. 13 is a flowchart showing an operation of the atomic oscillator. In this example embodiment, the overview of the configurations of the atomic oscillators and the control methods described in the above example embodiments is shown.

As shown in FIG. 12, an atomic oscillator 100 in this example embodiment includes a light generator 101 that generates two excitation lights, an alkali metal atom gas cell 102 to which the two excitation lights with the frequency difference therebetween being changed are applied, a detecting unit 103 that detects the light amount of a transmitted light having passed through the alkali metal atom gas cell, and a control unit 104 that measures a resonance frequency of an alkali metal atom gas based on the detected amount of the transmitted light and controls an intensity ratio of the two excitation lights applied to the alkali metal atom gas cell based on the measured resonance frequency.

Then, as shown in FIG. 13, the control unit 104 (control device) with the above configuration executes a process to measure the resonance frequency of the alkali metal atom gas based on the detected amount of the transmitted light (step S101) and control the intensity ratio of the two excitation lights applied to the alkali metal atom gas cell based on the measured resonance frequency (step S102). The process executed by the control unit 104 is realized by execution of a program by an operating processing device configuring the control unit 104.

As described above, in the present disclosure, by controlling the intensity ratio of the two excitation lights applied to the alkali metal atom gas cell based on the measured resonance frequency of the two excitation lights, it is possible to suppress the occurrence of a light shift.

Although the present disclosure has been described above with reference to the example embodiments and so on, the present disclosure is not limited to the above example embodiments. The configurations and details of the present disclosure can be changed in various manners that can be understood by one skilled in the art within the scope of the present disclosure.

<Supplementary Notes>

The whole or part of the example embodiments disclosed above can be described as the following supplementary notes. Below, the overview of the configurations of the atomic oscillator, the control method, the control device and the program according to the present disclosure will be described. However, the present disclosure is not limited to the following configurations.

(Supplementary Note 1)

An atomic oscillator comprising:
  a light generator configured to generate two excitation lights;
  an alkali metal atom gas cell to which the two excitation lights are applied with a frequency difference therebetween being changed;
  a detecting unit configured to detect an amount of a transmitted light having passed through the alkali metal atom gas cell; and a control unit configured to measure a resonance frequency of an alkali metal atom gas based on the detected amount of the transmitted light and control an intensity ratio of the two excitation lights applied to the alkali metal atom gas cell based on the measured resonance frequency.

(Supplementary Note 2)

The atomic oscillator according to Supplementary Note 1, wherein the control unit is configured to measure the resonance frequency when the two excitation lights are applied to the alkali metal atom gas cell with the intensity ratio of the two excitation lights being changed, and determine the intensity ratio of the two excitation lights based on a result of the measurement.

(Supplementary Note 3)

The atomic oscillator according to Supplementary Note 2, wherein the control unit is configured to measure the resonance frequency when the two excitation lights are applied to the alkali metal atom gas cell with the intensity ratio of the two excitation lights being changed and also a sum of intensities of the excitation lights being changed, and determine the intensity ratio of the two excitation lights based on a result of the measurement.

(Supplementary Note 4)

The atomic oscillator according to Supplementary Note 3, wherein the control unit is configured to, every time a value of the intensity ratio of the two excitation lights is changed, measure the resonance frequency when the two excitation lights are applied to the alkali metal atom gas cell with the sum of the intensities of the excitation lights being changed, and determine the intensity ratio of the two excitation lights based on a change of the resonance frequency with respect to the change of the sum of the intensities of the excitation lights.

(Supplementary Note 5)

The atomic oscillator according to Supplementary Note 4, wherein the control unit is configured to determine the intensity ratio of the two excitation lights so that the change of the resonance frequency with respect to the change of the sum of the intensities of the excitation lights becomes closer to 0.

(Supplementary Note 6)

The atomic oscillator according to Supplementary Note 4, wherein:

the light generator is configured to perform frequency modulation on one excitation light with a predetermined frequency modulation power and thereby generate excitation lights containing two frequency components; and the control unit is configured to change the frequency modulation power and thereby change the intensity ratio of the two excitation lights.

(Supplementary Note 7)

The atomic oscillator according to Supplementary Note 4, wherein:

the light generator is configured to perform frequency modulation on a drive current with a predetermined frequency modulation power and thereby generate excitation lights containing two frequency components; and the control unit is configured to change the frequency modulation power and thereby change the intensity ratio of the two excitation lights.

(Supplementary Note 8)

The atomic oscillator according to Supplementary Note 4, wherein:

the light generator has two light sources configured to generate excitation lights containing different frequency components, respectively; and the control unit is configured to change the intensity ratio of the excitation lights generated by the two light sources.

(Supplementary Note 9)

The atomic oscillator according to any of Supplementary Notes 6 to 8, wherein the light generator is configured to set a frequency of one excitation light of the two excitation lights around the resonance frequency.

(Supplementary Note 10)

A control method executed by an atomic oscillator, the atomic oscillator including a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell, the control method comprising measuring a resonance frequency of an alkali metal atom gas based on the detected amount of the transmitted light and controlling an intensity ratio of the two excitation lights applied to the alkali metal atom gas cell based on the measured resonance frequency.

(Supplementary Note 11)

A control device controlling an atomic oscillator, the atomic oscillator including a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell, the control device being configured to measure a resonance frequency of an alkali metal atom gas based on the detected amount of the transmitted light and control an intensity ratio of the two excitation lights applied to the alkali metal atom gas cell based on the measured resonance frequency.

(Supplementary Note 12)

A computer program comprising instructions for causing a control device, which controls an atomic oscillator including a light generator configured to generate two excitation lights, an alkali metal atom gas cell to which the two excitation lights are applied with a frequency difference therebetween being changed, and a detecting unit configured to detect a light amount of a transmitted light having passed through the alkali metal atom gas cell, to execute processes to measure a resonance frequency of an alkali metal atom gas based on the detected amount of the transmitted light and control an intensity ratio of the two excitation lights applied to the alkali metal atom gas cell based on the measured resonance frequency.

DESCRIPTION OF NUMERALS 1 light generator
2 cesium metal atom gas cell
3 light detector
4 controller
5 spectroscope
5a first spectroscope
5b second spectroscope
11 laser
11a first laser
11b second laser
12 optical frequency modulator
13 optical attenuator
13a first optical attenuator
13b second optical attenuator
14 mixer
15 polarizing plate
41 laser control unit
41a first laser control unit
41b second laser control unit
42 signal generator control unit
42a signal generator
43 optical attenuator control unit
43a first optical attenuator control unit
43b second optical attenuator control unit
44 calculating unit
45 current modulator control unit
45a current modulator
100 atomic oscillator
101 light generator
102 alkali metal atom gas cell
103 detecting unit
104 control unit

The invention claimed is:

1. An atomic oscillator comprising:
a light generator configured to generate two excitation lights;
an alkali metal atom gas cell to which the two excitation lights are applied with a frequency difference therebetween being changed;
a detecting unit configured to detect an amount of a transmitted light having passed through the alkali metal atom gas cell; and
a control unit configured to measure a resonance frequency of an alkali metal atom gas based on the detected amount of the transmitted light and control an intensity ratio of the two excitation lights applied to the alkali metal atom gas cell based on the measured resonance frequency, wherein
the control unit is configured to measure the resonance frequency when the two excitation lights are applied to the alkali metal atom gas cell with the intensity ratio of the two excitation lights being changed and also a sum of intensities of the excitation lights being changed, and determine the intensity ratio of the two excitation lights based on a result of the measurement.

2. The atomic oscillator according to claim 1, wherein the control unit is configured to, every time a value of the intensity ratio of the two excitation lights is changed, measure the resonance frequency when the two excitation lights are applied to the alkali metal atom gas cell with the sum of the intensities of the excitation lights being changed, and determine the intensity ratio of the two excitation lights based on a change of the resonance frequency with respect to the change of the sum of the intensities of the excitation lights.

3. The atomic oscillator according to claim 2, wherein the control unit is configured to determine the intensity ratio of the two excitation lights so that the change of the resonance frequency with respect to the change of the sum of the intensities of the excitation lights becomes closer to 0.

4. The atomic oscillator according to claim 2, wherein:
the light generator is configured to perform frequency modulation on one excitation light with a predetermined frequency modulation power and thereby generate excitation lights containing two frequency components; and
the control unit is configured to change the frequency modulation power and thereby change the intensity ratio of the two excitation lights.

5. The atomic oscillator according to claim 2, wherein:
the light generator is configured to perform frequency modulation on a drive current with a predetermined frequency modulation power and thereby generate excitation lights containing two frequency components; and
the control unit is configured to change the frequency modulation power and thereby change the intensity ratio of the two excitation lights.

6. The atomic oscillator according to claim 2, wherein:
the light generator has two light sources configured to generate excitation lights containing different frequency components, respectively; and
the control unit is configured to change the intensity ratio of the excitation lights generated by the two light sources.

7. The atomic oscillator according to claim 4, wherein the light generator is configured to set a frequency of one excitation light of the two excitation lights around the resonance frequency.

8. A control method executed by an atomic oscillator, the atomic oscillator including:
a light generator configured to generate two excitation lights;
an alkali metal atom gas cell to which the two excitation lights are applied with a frequency difference therebetween being changed; and
a detecting unit configured to detect a light amount of a transmitted light having passed through the alkali metal atom gas cell,
the control method comprising:
measuring a resonance frequency of an alkali metal atom gas based on the detected amount of the transmitted light and controlling an intensity ratio of the two excitation lights applied to the alkali metal atom gas cell based on the measured resonance frequency; and
measuring the resonance frequency when the two excitation lights are applied to the alkali metal atom gas cell with the intensity ratio of the two excitation lights being changed and also a sum of intensities of the excitation lights being changed, and determining the intensity ratio of the two excitation lights based on a result of the measurement.

9. A control device controlling an atomic oscillator, the atomic oscillator including:
a light generator configured to generate two excitation lights;
an alkali metal atom gas cell to which the two excitation lights are applied with a frequency difference therebetween being changed; and a detecting unit configured to detect a light amount of a transmitted light having passed through the alkali metal atom gas cell, wherein the control device is configured to measure a resonance frequency of an alkali metal atom gas based on the detected amount of the transmitted light and control an intensity ratio of the two excitation lights applied to the alkali metal atom gas cell based on the measured resonance frequency, and the control unit is configured to measure the resonance frequency when the two excitation lights are applied to the alkali metal atom gas cell with the intensity ratio of the two excitation lights being changed and also a sum of intensities of the excitation lights being changed, and determine the intensity ratio of the two excitation lights based on a result of the measurement.

* * * * *